United States Patent
Bois et al.

(10) Patent No.: US 7,068,734 B2
(45) Date of Patent: *Jun. 27, 2006

(54) PASSIVE REDUNDANT DIGITAL DATA RECEIVER WITH SCHMITT-TRIGGER

(75) Inventors: Karl Joseph Bois, Fort Collins, CO (US); David W. Quint, Fort Collins, CO (US); Randy K. Rannow, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 779 days.

This patent is subject to a terminal disclaimer.

(21) Appl. No.: 10/267,156

(22) Filed: Oct. 8, 2002

(65) Prior Publication Data

US 2004/0066859 A1    Apr. 8, 2004

(51) Int. Cl.
*H03K 9/00*    (2006.01)

(52) U.S. Cl. ............. 375/316; 375/257; 375/350; 375/229; 375/285; 379/386; 379/159; 327/36; 327/20; 324/166; 455/21; 333/118; 174/250

(58) Field of Classification Search ............. 375/316, 375/257; 379/386, 159; 327/36, 20, 70, 327/53, 65; 324/166; 455/21; 333/118; 174/250; 326/82

See application file for complete search history.

(56) References Cited

U.S. PATENT DOCUMENTS

| | | | | |
|---|---|---|---|---|
| 4,158,110 A | * | 6/1979 | Ullakko et al. | 379/159 |
| 4,253,191 A | * | 2/1981 | Oguchi | 455/21 |
| 4,868,872 A | * | 9/1989 | Roberts et al. | 379/386 |
| 5,012,207 A | * | 4/1991 | Edwards | 324/166 |
| 5,045,821 A | * | 9/1991 | Staudinger et al. | 333/118 |
| 5,533,053 A | * | 7/1996 | Hershbarger | 375/257 |
| 5,708,375 A | * | 1/1998 | Lemmens | 327/36 |
| 6,392,446 B1 | * | 5/2002 | Reasoner et al. | 327/20 |
| 2003/0221863 A1 | * | 12/2003 | Marshall et al. | 174/250 |
| 2004/0066860 A1 | * | 4/2004 | Bois et al. | 375/316 |

OTHER PUBLICATIONS

"Schmitt trigger"; http://en/wikipedia.org/wiki/Schmitt_trigger; "Schmitt trigger—Wikipedia, the free encyclopedia"; pp. 1-2.*
"Comparator"; http://en/wikipedia.org/wiki/Comparator; "Comparator—Wikipedia, the free encyclopedia"; p. 1.*
"Hysteresis and the Schmitt Trigger"; http://www.ee.ttu.edu/lab/robot/hyster.htm; pp. 1-3.*
Lancaster et al. (CMOS Cookbook; Schmitt Triggers; pp. 265-to-269; 2nd, Edition; 1992).*

* cited by examiner

*Primary Examiner*—Emmanuel Bayard
*Assistant Examiner*—Sudhanshu C. Pathak
(74) *Attorney, Agent, or Firm*—Alexander J. Neudeck

(57) ABSTRACT

A passive coupling structure constructed using printed circuit board traces is used to separate the low and high frequency components of an incoming digital signal. The low and high frequency components of the signal are sent to separate receivers on an integrated circuit. The low frequency receiver may be a conventional level based receiver. The high frequency receiver is a Schmitt-trigger with hysteresis around a DC level or two comparators with separate reference voltages. The outputs of these receivers are combined to produce a receiver output that has increased reliability and noise immunity.

12 Claims, 6 Drawing Sheets

PASSIVE REDUNDANT DIGITAL DATA RECEIVER WITH SCHMITT-TRIGGER

CROSS-REFERENCE TO RELATED APPLICATIONS

A related copending United States patent application commonly owned by the assignee of the present document and incorporated by reference in its entirety into this document is being filed in the United States Patent and Trademark Office on or about the same day as the present application. This related application is Hewlett-Packard 10/267,438, and is titled "PASSIVE REDUNDANT DIGITAL DATA RECEIVER WITH DUAL COMPARATOR EDGE DETECTION."

FIELD OF THE INVENTION

This invention relates generally to digital communication and more particularly to the communication of digital signals between integrated circuits.

BACKGROUND OF THE INVENTION

Digital signals carried on printed circuit board (PCB) traces are often used to carry digital data between or to integrated circuits. As the capability of modem integrated circuits has increased, so have the demands made upon the systems that communicate data between these devices. Factors such as speed, size, power dissipation, and electrical noise have combined to make it difficult to communicate digital data between integrated circuits at the speeds and with the reliability demanded of today's modern electronic systems.

SUMMARY OF THE INVENTION

A passive coupling structure constructed using printed circuit board, package, microstrip, or integrated circuit traces is tuned to separate the low and high frequency components of an incoming digital signal. The low and high frequency components of the signal are sent to separate receivers on an integrated circuit. The low frequency receiver may be a conventional level based receiver. The high frequency receiver is a Schmitt-trigger with hysteresis around a DC level. The outputs of these receivers are combined to produce a receiver output that has increased reliability and noise immunity.

DETAILED DESCRIPTION OF THE PREFERRED EMBODIMENTS

Figure 1:
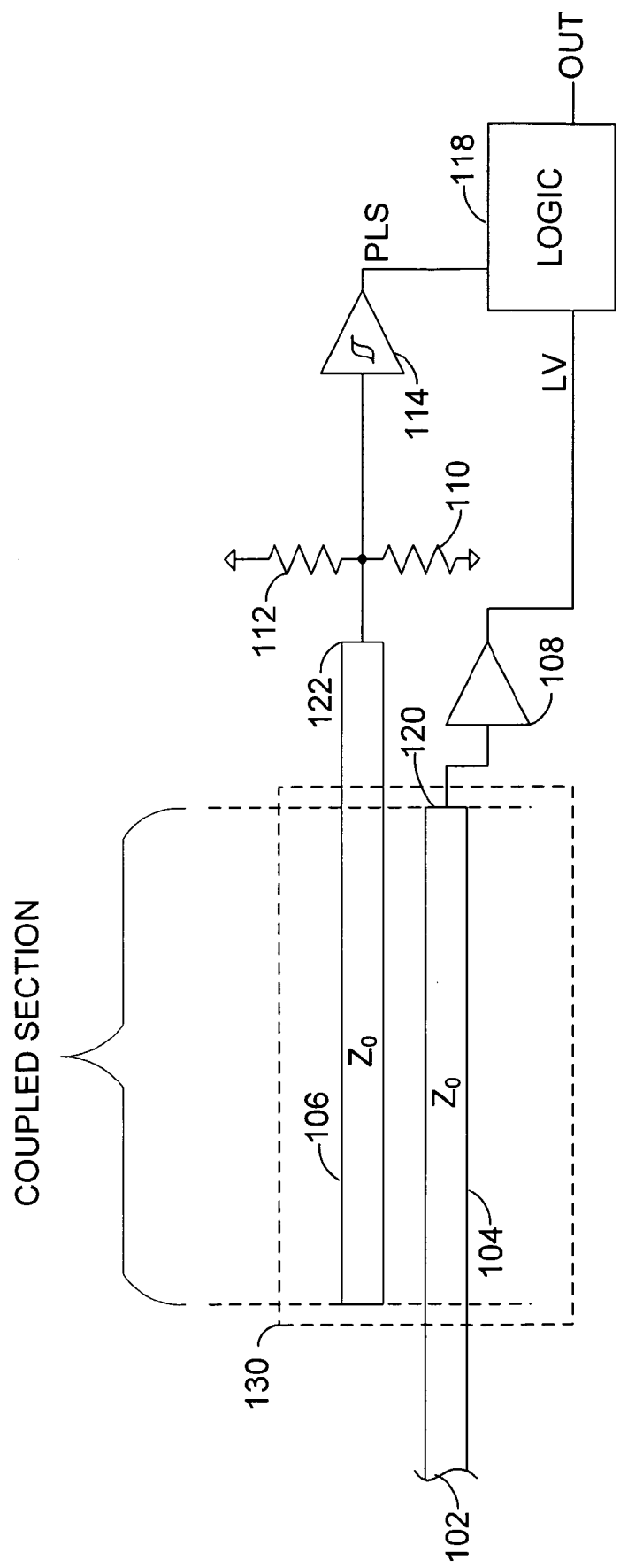
FIG. 1 is an illustration of passive redundant digital data receiver with a Schmitt-trigger as the high frequency receiver.

FIG. 1 is an illustration of passive redundant digital data receiver with a Schmitt-trigger as the high frequency receiver. A passive coupling structure is shown generally inside box 130. The passive coupling structure is comprised of two parallel package, microstrip, integrated circuit, or printed circuit board (PCB) lines 104, 106 that have at least a portion of their lengths close together. In FIG. 1, the characteristic impedance of lines 104 and 106 are shown as $Z_0$. However, in other embodiments these lines may have different characteristic impedances. The portion of lines 104, 106 that are close together comprise the passive coupling structure 130. The spacing of these lines in the passive coupling structure 130 is chosen to set certain desired characteristics of the passive coupling structure 130 including the coupling factor, even mode impedance ($Z_{oe}$), and odd mode impedance ($Z_{oo}$). The length of the coupled sections of lines 104, 106 comprising the passive coupling structure 130 is shown in FIG. 1 and is also chosen to set certain desired characteristics of the passive coupling structure 130 such as the maximum and minimum frequency of coupling. The input signal is fed to the passive coupling structure 130 via a non-coupled part of line 104 shown as point 102. One output of the passive coupling structure 130 is via a non-coupled portion of line 106.

The end of line 106 carrying this output of the output of coupling structure 130 is shown as point 122. Another output of the passive coupling structure 130 is the end of line 104 shown as point 120.

Connected to the end of line 104 at point 120 is the input of level based receiver 108. The output of level based receiver 108, LV, is connected to an input of logic block 118. The end of line 106 is connected to terminating/bias resistors 110 and 112 and the input of Schmitt-trigger 114. The other end of terminating/bias resistor 110 is shown connected to a negative supply voltage. The other end of terminating/bias resistor 112 is shown connected to a positive supply voltage. The output of Schmitt-trigger 114, PLS, is connected to logic block 118. The output of logic block 118 is signal OUT.

Passive coupling structure 130 functions to separate the low and high frequency components of the incoming digital signal applied at 102. The crossover frequency between the low and high frequency components is determined by the geometry of the passive coupling structure. The low frequency component of the incoming digital signal is output at 120 and received by level based receiver 108. The high frequency component of the incoming digital signal is propagated along line 106 to 122 to be received by Schmitt-trigger 114. Terminating/bias resistors 110, 112 provide two functions. The first is to terminate the end of line 106 so that no reflections of the high frequency component of the input signal are propagated back into the coupling structure. The second is to bias the DC level present at the input of the Schmitt-trigger to a point that is between the two trigger points of the Schmitt-trigger. In one embodiment, terminating/bias resistors 110 and 112 are both chosen to be twice the characteristic impedance of line 106. In other words, they are chosen to be $2*Z_0$.

Figure 3:
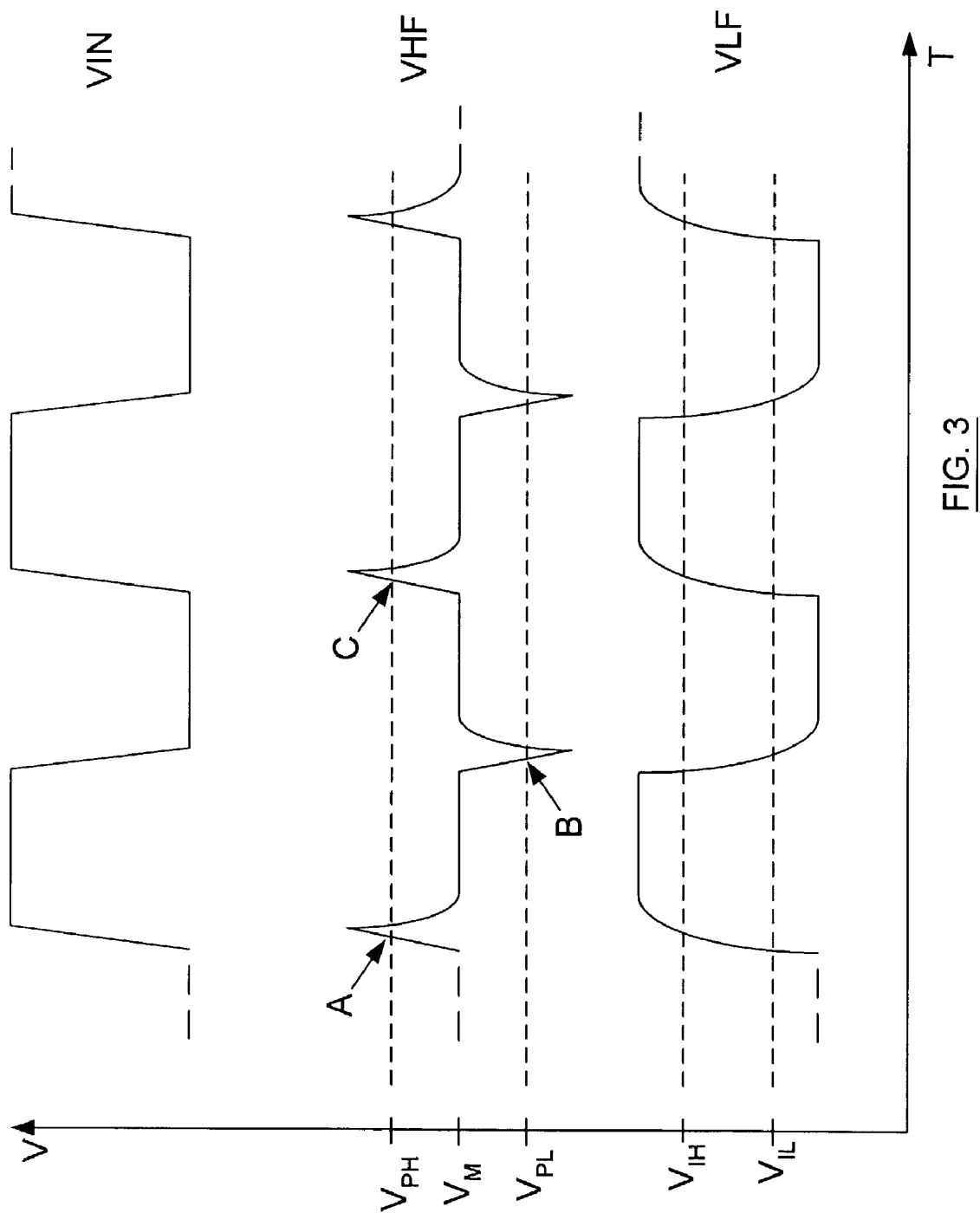
FIG. 3 is an illustration of several voltages on a passive redundant digital data receiver.

FIG. 3 is an illustration of several voltages on a passive redundant digital data receiver. In FIG. 3, the waveform labeled VIN is a representative waveform that may be applied to the input of the passive redundant digital data receiver at point 102. The high frequency component of VIN, shown as VHF, is a representative waveform that may result at point 122 when the waveform VIN is applied at point 102. The low frequency component of VIN, shown as VLF, is a representative waveform that may result at point 120 when the waveform VIN is applied at point 102. In FIG. 3, $V_M$ represents the DC level present at point 122 as set by terminating/bias resistors 110 and 112. $V_{IH}$ and $V_{IL}$ represent voltage levels that determine the output of level based receiver 108. When the voltage at point 120 is above $V_{IH}$, level based receiver 108 will output a high logic level. When the voltage at point 120 is below $V_{IL}$, level based receiver 108 will output a low logic level. When the voltage at point 120 is between $V_{IH}$ and $V_{IL}$ then the output of level based receiver may be undetermined.

$V_{PH}$ and $V_{PL}$ represent voltage levels around $V_M$ that trigger changes on the output of Schmitt-trigger 114. For example, if Schmitt-trigger 114 is outputting a high logic level on signal PLS, then the voltage at point 122 would need to go below $V_{PL}$ to cause Schmitt-trigger 114 to trip and switch to outputting a low logic level. Likewise, if Schmitt-trigger 114 is outputting a low logic level on signal PLS, then the voltage at point 122 would need to go above $V_{PH}$ to cause Schmitt-trigger 114 to trip and switch to outputting a high logic level. Accordingly, as shown in FIG. 3, at point A, when the voltage at the input to Schmitt-trigger 114 exceeds $V_{PH}$, the output of Schmitt-trigger 114 would switch from a low logic level to a high logic level. Then, at point B in FIG. 3, the voltage at the input to Schmitt-trigger 114 goes below $V_{PL}$, Schmitt-trigger 114 switches from a high logic level to a low logic level. Finally, at point C in FIG. 3, Schmitt-trigger 114 switches back to a high logic level as the voltage at point 122 once again exceeds $V_{PH}$. Accordingly, since Schmitt-trigger 114 is receiving the high frequency component, the Schmitt-trigger changes state whenever an appropriately fast edge occurs in the appropriate direction. In other words, Schmitt-trigger 114 in combination with the passive couple structure 130 serves to detect edges that are occurring in the state change direction, but not in the direction that serves to maintain the current state.

Figure 2:
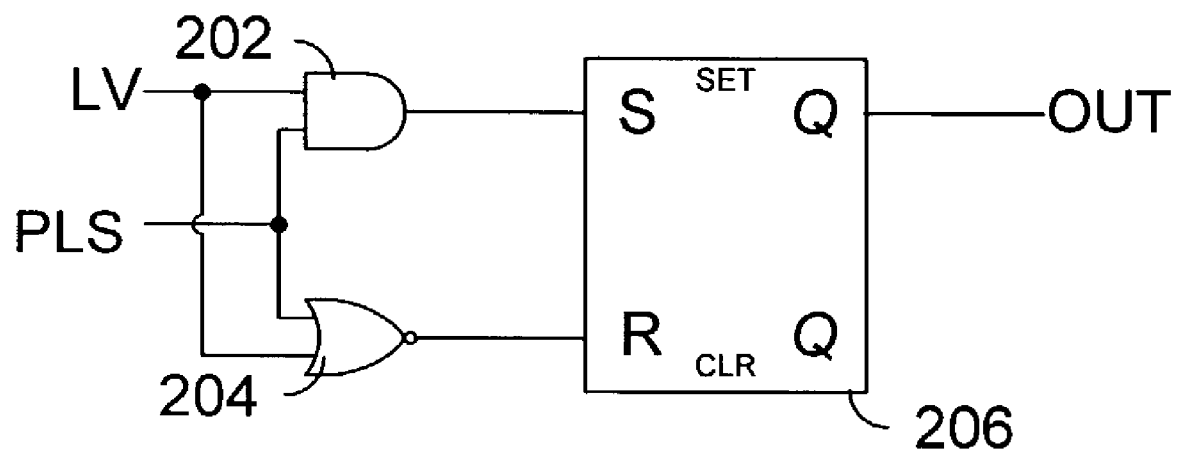
FIG. 2 is a schematic illustration of a logic block that may be used to combine the redundant receiver outputs.

FIG. 2 is a schematic illustration of a logic block that may be used to combine the redundant receiver outputs. The circuit shown in FIG. 2 may be used as logic block 118. Other circuits may also be used as logic block 118.

In FIG. 2, the output of Schmitt-trigger 114, signal PLS is connected to a first input of two input AND gate 202 and a first input of two input NOR gate 204. The output of level based receiver 108, signal LV, is connected to the second input of AND gate 202 and the second input of NOR gate 204. The output of AND gate 202 is connected to the SET (or S) input of set-reset flip-flop 206 (SR flip-flop 206). Accordingly, when LV and PLS are both at high logic levels, SR flip-flop 206 is set thereby causing signal OUT to go to a high logic level. The output of NOR gate 202 is connected to the REST (or R) input of SR flip-flop 206. Therefore, when LV and PLS are both at low logic levels, SR flip-flop 206 is reset thereby causing signal OUT to go to a low logic level.

The circuit in FIG. 1 when used with the circuit of FIG. 2 provides a passive redundant digital data receiver. The low frequency component of the input signal is sent to the low frequency receiver that is level based receiver 108. The high frequency component of the input signal is sent to the high frequency receiver that is Schmitt-trigger 114 with hysteresis around a DC level $V_M$. Accordingly, when a transition occurs on the input signal from a low logic level to a high logic level, both the low frequency receiver (because a level change from below $V_{IL}$ to above $V_{IH}$ occurs on its input) and the high frequency receiver (because its input at least momentarily exceeds $V_{PH}$) change from a low logic level to a high logic level. This causes AND gate 202 to set SR flip-flop 206. Likewise, when a transition occurs on the input signal from a high logic level to a low logic level, both the low frequency receiver (because a level change from above $V_{IH}$ to below $V_{IL}$ occurs on its input) and the high frequency receiver (because its input at least momentarily drops below $V_{PL}$) change from a high logic level to a low logic level. This causes NOR gate 204 to reset SR flip-flop 206. Thus, the redundancy of this system provides noise immunity because many noise events would not have the appropriate energy and duration to trip both the low and high frequency receivers at the same time thereby changing the state of SR flip-flop 206.

Figure 4:
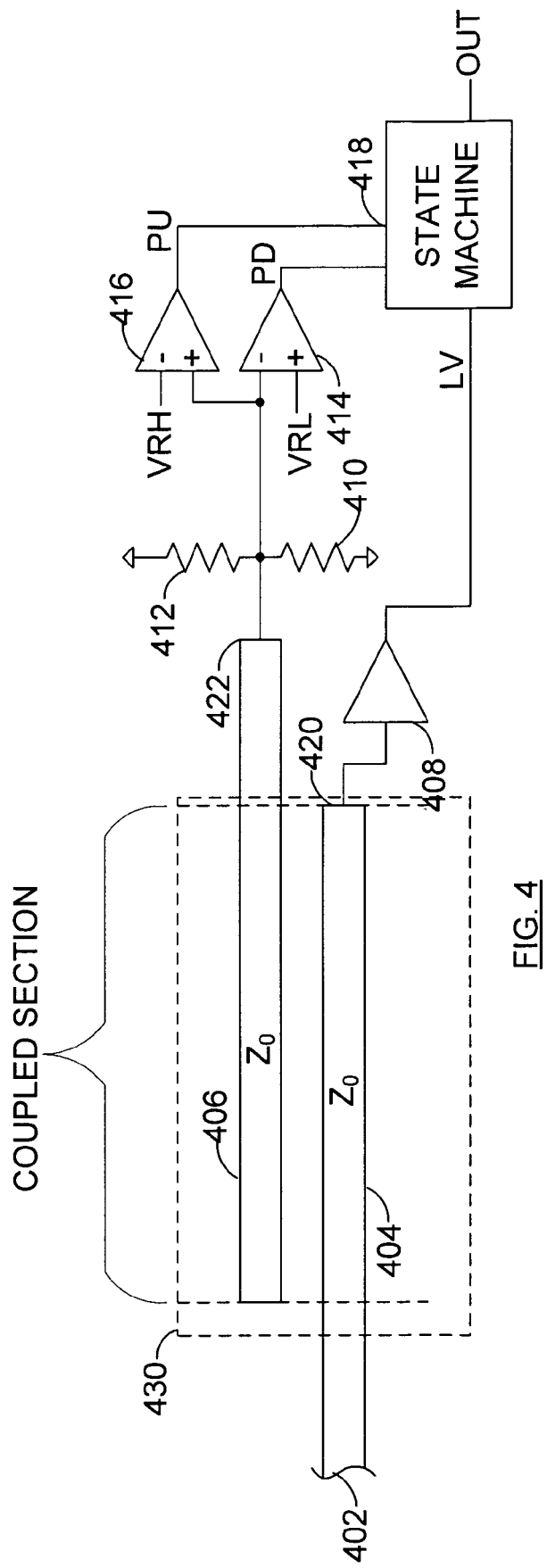
FIG. 4 is an illustration of a passive redundant digital data receiver with dual comparators as the high frequency receiver.

FIG. 4 is an illustration of a passive redundant digital data receiver with dual comparators as the high frequency receiver. A passive coupling structure is shown generally inside box 430. The passive coupling structure is comprised of two parallel package, microstrip, integrated circuit, or printed circuit board (PCB) lines 404, 406 that have at least a portion of their lengths close together. In FIG. 4, the characteristic impedance of lines 404 and 406 are shown as $Z_0$. However, in other embodiments these lines may have different characteristic impedances. The portion of lines 404, 406 that are close together comprise the passive coupling structure 430. The spacing of these lines in the passive coupling structure 430 is chosen to set certain desired characteristics of the passive coupling structure 430 including the coupling factor, even mode impedance ($Z_{oe}$), and odd mode impedance ($Z_{oo}$). The length of the coupled sections of lines 404, 406 comprising the passive coupling structure 430 is shown in FIG. 4 and is also chosen to set certain desired characteristics of the passive coupling structure 430 such as the maximum and minimum frequency of coupling. The input signal is fed to the passive coupling structure 430 via a non-coupled part of line 404 shown as point 402. One output of the passive coupling structure 430 is via a non-coupled portion of line 406. The end of line 406 carrying this output of the output of coupling structure 430 is shown as point 422. Another output of the passive coupling structure 430 is the end of line 404 shown as point 420.

Connected to the end of line 404 at point 420 is the input of level based receiver 408. The output of level based receiver 408, LV, is connected to an input of state machine 418. The end of line 406 is connected to terminating/bias resistors 410 and 412, the inverting input of comparator 414, and the non-inverting input of comparator 416. The other end of terminating/bias resistor 410 is shown connected to a negative supply voltage. The other end of terminating/bias resistor 412 is shown connected to a positive supply voltage. The non-inverting input of comparator 414 is connected to reference voltage VRL. The inverting input of comparator 416 is connected to reference voltage VRH. The output of comparator 414, signal PD, is connected to state machine 418. The output of comparator 416, signal PU, is connected to state machine 418. The output of state machine 118 is signal OUT.

Passive coupling structure 430 functions to separate the low and high frequency components of the incoming digital signal applied at 402. The crossover frequency between the low and high frequency components is determined by the geometry of the passive coupling structure. The low frequency component of the incoming digital signal is output at 420 and received by level based receiver 408. The high frequency component of the incoming digital signal is propagated along line 406 to 422 to be received by comparators 414 and 416. Terminating/bias resistors 410, 412 provide two functions. The first is to terminate the end of line 406 so that no reflections of the high frequency component of the input signal are propagated back into the coupling structure. The second is to bias the DC level present at the inputs of comparators 414 and 416 to a point that is between the two reference voltage VRL and VRH. In one embodiment, terminating/bias resistors 410 and 412 are both chosen to be twice the characteristic impedance of line 406. In other words, they are chosen to be $2*Z_0$.

Figure 6:
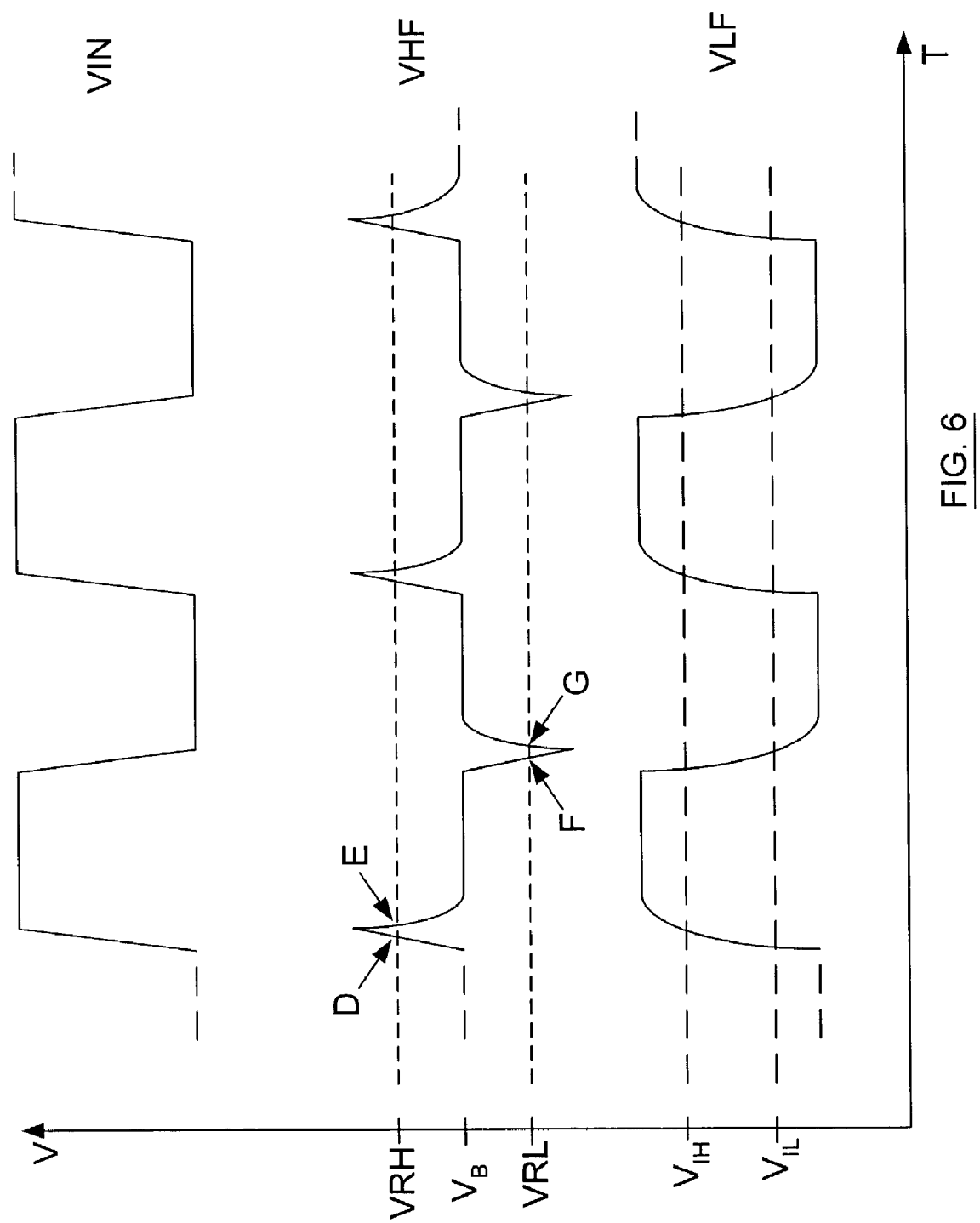
FIG. 6 is an illustration of several voltages on a passive redundant digital data receiver.

FIG. 6 is an illustration of several voltages on a passive redundant digital data receiver. In FIG. 6, the waveform labeled VIN is a representative waveform that may be applied to the input of the passive redundant digital data receiver at point 402. The high frequency component of VIN, shown as VHF, is a representative waveform that may result at point 422 when the waveform VIN is applied at point 402. The low frequency component of VIN, shown as VLF, is a representative waveform that may result at point 420 when the waveform VIN is applied at point 402. In FIG. 6, $V_B$ represents the DC level present at point 422 as set by terminating/bias resistors 410 and 412. $V_{IH}$ and $V_{IL}$ represent voltage levels that determine the output of level based receiver 408. When the voltage at point 420 is above $V_{IH}$, level based receiver 408 will output a high logic level. When the voltage at point 420 is below $V_{IL}$, level based receiver 408 will output a low logic level. When the voltage at point 420 is between $V_{IH}$ and $V_{IL}$ then the output of level based receiver 408 may be undetermined.

VRH and VRL are the reference voltages connected to the inverting input of comparator 416 and the non-inverting input of comparator 414, respectively. Accordingly, as shown in FIG. 6, at point D, when the voltage at the non-inverting input to comparator 416 exceeds VRH, the output of comparator 416 would switch from a low logic level to a high logic level. Then, at point E in FIG. 6, when the voltage at the non-inverting input to comparator 416 goes below VRH, the output of comparator 416 would switch from a high logic level to a low logic level. At point F in FIG. 6, when the inverting input of comparator 414 goes below VRL, the output of comparator 414 would switch from a low logic level to a high logic level. Then, at point G in FIG. 6, when the voltage at the inverting input to comparator 414 goes above VRL, the output of comparator 414 switches from a high logic level to a low logic level.

Figure 5:
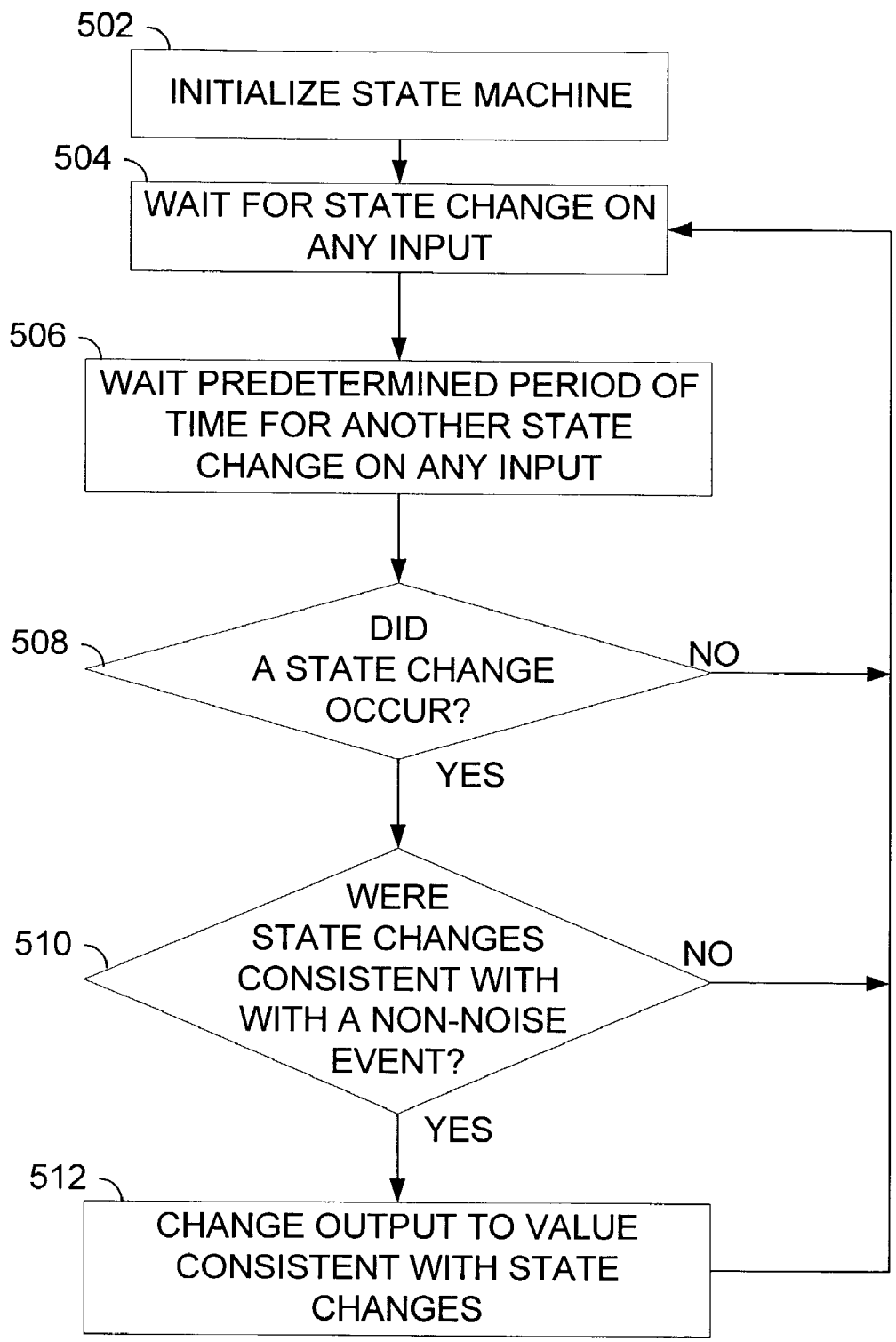
FIG. 5 is a flowchart of a state machine that interprets the inputs from the level and dual comparator receivers.

FIG. 5 is a flowchart of a state machine that interprets the inputs from the level and dual comparator receivers. This state machine may be used as state machine 418. In a step 502, the state machine is initialized. In one embodiment, once both PU and PD were at low logic levels, this initialization would comprise setting the output of the state machine (OUT) to the value on the level based receiver input, LV. After step 502, control passes to step 504. In a step 504, the state machine waits for a logic state change on any of the inputs PU, PD, and LV. Once a state change occurs, control passes to step 506. In a step 506, the state machine waits a predetermined amount of time for another state change on any of the input PU, PD, and LV. Control then passes to step 508. In step 508, if a state change did not occur, it is assumed that the state change was a noise event and control is then passed back to step 504. If a state change did occur, then control is passed to step 510. In a step 510, if the state changes that occurred during the predetermined period of time are not consistent with a non-noise event, control is passed to step 504. If the state changes that occurred during the predetermined period of time are consistent with a non-noise event, control is passed to step 512.

Table 1 gives an example set of state changes that may be considered consistent with a non-noise event. Other sets may be used depending upon the environment or design parameters. In step 512, the output of the state machine is changes to a value that is consistent with the state changes observed during the predetermined period of time. Control is then passed to step 504.

TABLE 1

| First state change | Other state change | Output value |
|---|---|---|
| PU ↑ | LV ↑ | high |
| PD ↑ | LV ↓ | low |
| LV ↑ | PU ↑ | high |
| LV ↓ | PD ↓ | low |

What is claimed is:

1. A digital signal receiver, comprising:
   a passive coupling structure having a signal input, a low frequency component output, and a high frequency component output;
   a level based receiver having a first input connected to said low frequency component output and a first output;
   a Schmitt-trigger having a second input connected said high frequency component output and a second output and wherein said high frequency component output is biased to a DC voltage level that is between a first and a second trip point of said Schmitt-trigger; and,
   a logic block receiving said first and second output that changes a receiver output when said first and second output both change to the same logic level.

2. The digital signal receiver of claim 1 wherein said passive coupling structure comprises a first and a second printed circuit board lines that are parallel for at least a portion of their lengths and a first end of said first line is said signal input and a second end of said first line is said low frequency component output and a first end of said second line is said high frequency component output.

3. The digital signal receiver of claim 1 wherein said logic block is comprised of an AND function receiving said first output and said second output and producing an AND function output and an OR function receiving said first output and said second output and producing an OR function output and said AND function output and said OR function output set and reset a flip-flop to change said receiver output.

4. The digital signal receiver of claim 2 wherein said logic block is comprised of an AND function receiving said first output and said second output and producing an AND function output and an OR function receiving said first output and said second output and producing an OR function output and said AND function output and said OR function output set and reset a flip-flop to change said receiver output.

5. The digital signal receiver of claim 1 wherein said passive coupling structure comprises a first and a second microstrip lines that are parallel for at least a portion of their lengths and a first end of said first line is said signal input and a second end of said first line is said low frequency component output and a first end of said second line is said high frequency component output.

6. A redundant digital receiver, comprising:
   a level based receiver coupled to the low frequency output of a passive coupling structure comprised of two parallel circuit lines;
   a Schmitt-trigger receiver having a high and a low trip points that is coupled to the high frequency output of said passive coupling structure;

at least one resistor that sets a DC bias on said high frequency output wherein said DC bias is between said high and low trip points of said Schmitt-trigger receiver; and, a logic block that receives a level based output from said level based receiver and an edge based output from said Schmitt-trigger and combines those outputs to change the state of a receiver output only when both said level based and said edge based outputs indicate that a state change on an input signal to said passive coupling structure has occurred.

7. The redundant receiver of claim 6 wherein said logic block is comprised of an AND function receiving said level based output and said edge based output and producing an AND function output and an OR function receiving said first level based output and said edge based output and producing an OR function output and said AND function output and said OR function output set and reset a flip-flop to change said receiver output.

8. The redundant receiver of claim 6 wherein said passive coupling structure comprises a first end of a first of said parallel circuit lines receives said input signal and a second end of said first of said parallel circuit lines is said low frequency output and a first end of a second of said parallel circuit lines is said high frequency output and a second end of said second of said parallel circuit lines is an open circuit.

9. A method of receiving digital signals, comprising:
splitting an input signal into a high frequency component and a low frequency component;
detecting a state of said low frequency component using a level based receiver to produce a level based output;
detecting an occurrence of an edge on said high frequency component using a Schmitt-trigger to produce an edge based output;
combining said level based and said edge based output to set the state of a receiver output when both said level based and said edge based output indicate that a state change on said input signal has occurred.

10. The method of claim 9 further comprising:
biasing said high frequency component to a DC level that is between a low trip point and a high trip point of said Schmitt-trigger.

11. The method of claim 9 wherein said splitting is done by a passive coupling structure comprised of two parallel circuit lines.

12. The method of claim 11 wherein a first end of a first of said parallel circuit lines receives said input signal and a second end of said first of said parallel circuit lines is said low frequency output and a first end of a second of said parallel circuit lines is said high frequency output and a second end of said second of said parallel circuit lines is an open circuit.

* * * * *

UNITED STATES PATENT AND TRADEMARK OFFICE
CERTIFICATE OF CORRECTION

| | | |
|---|---|---|
| PATENT NO. | : 7,068,734 B2 | Page 1 of 1 |
| APPLICATION NO. | : 10/267156 | |
| DATED | : June 27, 2006 | |
| INVENTOR(S) | : Karl Joseph Bois et al. | |

It is certified that error appears in the above-identified patent and that said Letters Patent is hereby corrected as shown below:

In column 1, line 13, insert -- serial number -- before "10/267,438".

In column 1, line 27, delete "modem" and insert -- modern --, therefor.

Signed and Sealed this
Third Day of July, 2012

David J. Kappos
*Director of the United States Patent and Trademark Office*